(12) United States Patent
Baschnagel

(10) Patent No.: US 9,172,782 B2
(45) Date of Patent: Oct. 27, 2015

(54) FLUSH MOUNTING STAND, HANGER/CARRY HANDLE FOR MOBILE ELECTRONIC DEVICE

(71) Applicant: Robert Baschnagel, Garden City, NY (US)

(72) Inventor: Robert Baschnagel, Garden City, NY (US)

( * ) Notice: Subject to any disclaimer, the term of this patent is extended or adjusted under 35 U.S.C. 154(b) by 123 days.

(21) Appl. No.: 14/138,034

(22) Filed: Dec. 21, 2013

(65) Prior Publication Data

US 2015/0181008 A1  Jun. 25, 2015

(51) Int. Cl.
*H04M 1/00* (2006.01)
*H04M 1/04* (2006.01)

(52) U.S. Cl.
CPC ....................................... *H04M 1/04* (2013.01)

(58) Field of Classification Search
CPC ............ B60R 11/02; B60R 2011/0059; B60R 2011/0071; B60R 11/0241; H04B 1/3883; H04M 1/0274; H04M 1/0283; H04M 1/04; H04M 2001/0204; H05K 5/0086; H05K 5/0204; H05K 5/0221; H05K 5/0247
USPC .......... 455/575.1, 575.4, 90, 575, 128, 569.1, 455/556.1, 425, 575.6, 575.8; 361/679.01, 361/679.55, 679.3, 679.56; 248/121, 291.1, 248/309.1, 205.1, 231.81, 316.1, 689, 248/206.2, 274.1; 345/156, 7
See application file for complete search history.

(56) References Cited

U.S. PATENT DOCUMENTS

| | | | | |
|---|---|---|---|---|
| 5,825,874 A * | 10/1998 | Humphreys et al. | ........... | 379/446 |
| 5,988,577 A * | 11/1999 | Phillips et al. | ............ | 248/231.81 |
| 8,243,432 B2 * | 8/2012 | Duan et al. | .................. | 361/679.3 |
| 2007/0164987 A1 * | 7/2007 | Graham | ........................ | 345/156 |
| 2010/0197372 A1 * | 8/2010 | Takagi et al. | ............... | 455/575.4 |
| 2010/0259876 A1 * | 10/2010 | Kim | ......................... | 361/679.01 |
| 2011/0031287 A1 * | 2/2011 | Le Gette et al. | .............. | 224/101 |
| 2011/0170812 A1 * | 7/2011 | Lee | ................................ | 384/26 |
| 2011/0240830 A1 * | 10/2011 | Alemozafar et al. | ......... | 248/689 |
| 2011/0310544 A1 * | 12/2011 | Larsen | ...................... | 361/679.01 |
| 2012/0168581 A1 * | 7/2012 | Cheng et al. | ................ | 248/206.2 |
| 2012/0199501 A1 * | 8/2012 | Le Gette et al. | ........... | 206/45.24 |
| 2012/0314354 A1 * | 12/2012 | Rayner | ..................... | 361/679.01 |
| 2013/0078855 A1 * | 3/2013 | Hornick et al. | ................ | 439/571 |
| 2013/0187020 A1 * | 7/2013 | Trotsky | ....................... | 248/309.3 |
| 2013/0233986 A1 * | 9/2013 | Rasheta | ..................... | 248/205.1 |
| 2013/0256478 A1 * | 10/2013 | Reda et al. | .................. | 248/205.1 |
| 2014/0085814 A1 * | 3/2014 | Kielland | ................... | 361/679.55 |
| 2014/0217862 A1 * | 8/2014 | Rayner | ....................... | 312/223.1 |
| 2014/0228075 A1 * | 8/2014 | Baschnagel | ................... | 455/557 |

* cited by examiner

Primary Examiner — Tan Trinh

(57) ABSTRACT

The present invention relates to a flush mounting stand, hanger, carry handle for mobile device. The device has a unique attachment member which can perform as a stand to support the mobile device on a flat surface or perform hanging function to support the mobile device over an object such as a door handle, a cabinet handle, etc. The device according to the principles of the present invention comprises an attachment member that can bend around a hinge or stay straight as desirable.

15 Claims, 15 Drawing Sheets

FLUSH MOUNTING STAND, HANGER/CARRY HANDLE FOR MOBILE ELECTRONIC DEVICE

CROSS-REFERENCE

This is a continuation-in-part application to the U.S. application Ser. No. 13/766,387, filed Feb. 13, 2013 from which priority is claimed, and entirety of which is hereby incorporated by reference.

BACKGROUND OF THE INVENTION

1. Field of the Invention

The present invention relates to a supporting device for mobile electronic devices and more particular to a flash mounting stand, hanger, or carry handle for mobile electronic devices that allows for the carry of both an ipad and cellphone or an ipad and virtual keyboard projection device to be carried and function simultaneously.

2. Description of Related Art

The prior art discloses various devices for supporting mobile electronic devices, in addition to assorted means for securing such devices to objects such as a vehicle dashboard, hand-held microphone, motorcycle gas tank, bicycle, and a person's wrist.

However, the prior art has failed to disclose a device having a unique attachment means which is able to hang over an object such as a piece of furniture or a door knob or a car seat headrest to support a mobile device, and is able to support a mobile device on a flat surface such as a desk.

Therein when supporting a mobile device on a flat surface said invention is also able to elevate the electronic device to allow for better communication with other devices nearby that rely upon infer-red or blue tooth communications with one another. Such elevation can be rather dramatic and the electronic device can be raised as much as six inches or more above the surface upon which the system described in this application sits.

Additionally, by being elevated a virtual keyboard projection device can function properly when built in to an electronic device and said electronic device is elevated above a flat surface as this invention allows for.

This invention has innovative features that also allows for the attachment of both a stand-alone cell phone, virtual keyboard projection device or any other similar sized device with an ipad device—both items being located side by side next to one another and fully functional and with their face side fully visible to an end-user of this device as described herein. The layout is such that the ipod is located on top of the virtual keyboard projection device and do not interfere with one another's functionality.

It is noted that any movement detection type device can be utilized with this invention and not necessarily just a virtual keyboard projection device. Any device that picks up ones movement for such interaction as video gaming could also be incorporated herein.

Also, by being supported above a flat surface within an elevated mounting stand, this invention as described herein allows for any said electronic device that is attached to it to be protected from pools of liquid that could spill on the underlying table itself upon which the invented device stands but the attached electronic device is elevated above the table top or flat surface itself.

Accordingly, a long felt need has been realized for a device adapted for supporting a mobile electronic device which protective features, features that allow for the duplicity of holding related electronic devices similtaniously (both a cell phone and an ipod within the same invented device) and which is further adapted for removable attachment to furniture such as a cabinet's or dresser's handle or door knob. The device according to the present invention discussed later fulfills this need.

SUMMARY OF THE INVENTION

In an exemplary embodiment of the present invention, there is disclosed a device for supporting mobile devices and with features that allow for protection as well as the ability to contain more than one electronic device within the same supporting system that is discussed herein and comprises this invention. Said mobile devices include but are not limited to tablets such as Ipads® and multimedia players, iphones, and related supporting devices such as virtual keyboard communication and projection systems.

The device can perform as a stand which stands above the table and holds one or more mobile devices above the table as well. The benefit of this is that a spill of a coffee cup will not get onto the mobile device from the table because the electronic device will not be sitting in a pool of coffee. The device would be elevated from the table itself.

Furthermore, the invented device can hang over a piece of furniture or a door. Its handle portion can be removed and reattached as needed. It can also lock in place and lock in different positions. It can be used as a carrying handle. In this way it is able to keep the user's hands away from actually touching the mobile device itself. As a result, the radiation that is given off of a mobile device is able to dissipate and not get absorbed by the end-user as would be the case if the end-user is actually holding on to the mobile device itself.

The device can be put over the car front seat headrest and draped over the back of the front seat. In this way it creates a use for kids in the back to watch movies, games, etc. or whatever is shown on the mobile device itself. One embodiment of said invention can have a portion of the handle removably attached so that if it does not fit over a car headrest it can still be attached to the neck portion between said headrest and the backing of the car seat itself.

The device according to the principles of the present invention comprises a case and an attachment member that can be attached to the case. The attachment member can perform as a stand to support the mobile device on a flat surface or perform hanging function to support the mobile device hung over an object such as a doorknob or handle of furniture or a car seat headrest, etc.

The case is substantially rectangular in shape, includes a recess area on the front side for receiving one or more mobile electronic devices, and one or more of a variety of means for receiving the attachment member.

In one embodiment, the device comprises a case which is rectangular in shape that includes a recess area on the front side for receiving a mobile electronic device/tablet. The case comprises a groove on each of the two lateral sides and a track in the middle of each groove. An attachment being in a U-shape has two vertical bars sitting on the top of the tracks and lying flush within the grooves. The vertical bars of the attachment member can move on top of the track of the case until it reaches the stopper on the bottom of each groove or the bottom of the groove edge. The protruding attachment member can be used as a stand or a hanger to support the case together with the mobile device on a flat surface or over any suitable object.

In another embodiment, the case has two channels along the lateral sides and the attachment having a U-shape body and two elongated legs hingedly connected to the bottom of the vertical bars of the U-shape body at hinge joints. The legs move up and down inside the channels; the protruding parts together with the U-shape body perform as a stand or a hanger or a handle to support the mobile device within the case. The hinge joints on the attachment member also serve like a stopper.

In another embodiment, the case is as such that both an ipad and a cell phone can be positioned flat within the case and the front side of both devices are facing forward for use of the front screens of both devices.

In another embodiment, the case is as such that both an ipad and a related virtual keyboard device are both positioned flat within the case so that upon positioning on a flat table surface, the ipad and virtual keyboard device are elevated to a desired position so that the virtual keyboard will be able to project and display a functioning keyboard down onto the flat table surface. The ipad being positioned on the top portion of the invented device and the virtual keyboard being located on the bottom portion of the invented device. Therefore, and interference from the projection from either of the devices will not hinder one another and yet both devices will still be able to communicate with one another and function in harmony.

The more important features of the invention have thus been outlined in order that the more detailed description that follows may be better understood and in order that the present contribution to the art may better be appreciated. Additional features of the invention will be described hereinafter and will form the subject matter of the claims that follow.

Before explaining at least one embodiment of the invention in detail, it is to be understood that the invention is not limited in its application to the details of construction and the arrangements of the components set forth in the following description or illustrated in the drawings. The invention is capable of other embodiments and of being practiced and carried out in various ways. Also it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

The foregoing has outlined, rather broadly, the preferred feature of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention and that such other structures do not depart from the spirit and scope of the invention in its broadest form.

BRIEF DESCRIPTION OF THE DRAWINGS

Other aspects, features, and advantages of the present invention will become more fully apparent from the following detailed description, the appended claim, and the accompanying drawings in which similar elements are given similar reference numerals.

DESCRIPTION OF THE PREFERRED EMBODIMENT

Figure 1:
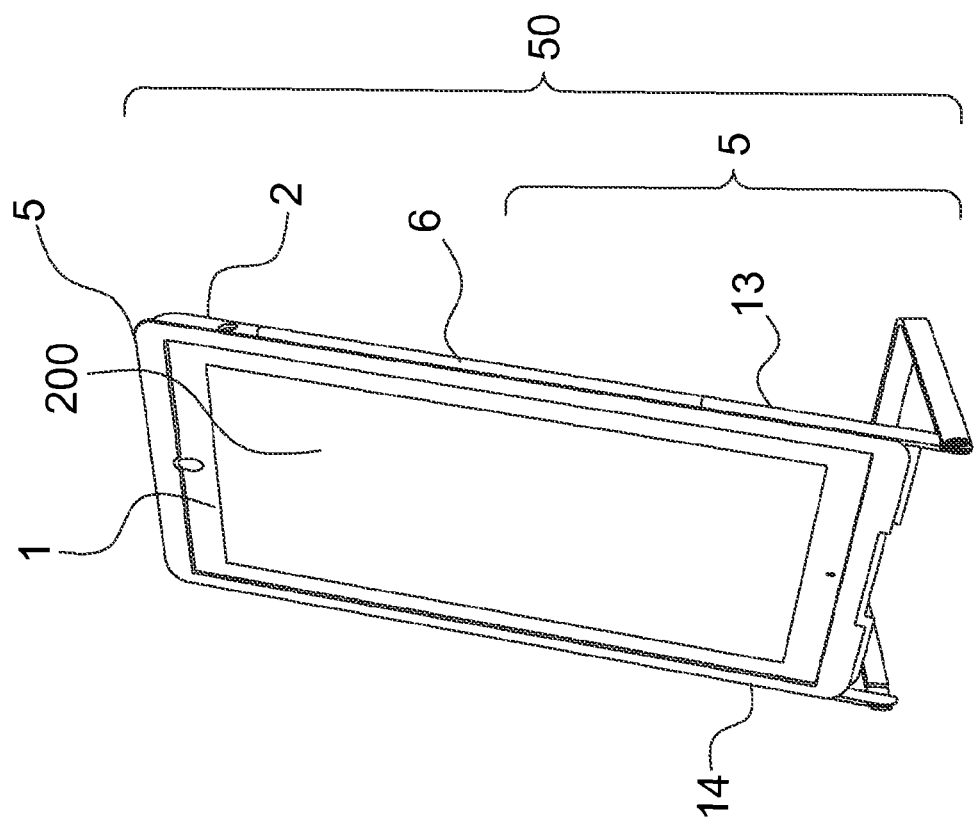
FIG. 1 is a perspective front view of a first embodiment of a device according to the present invention which can function as a mounting stand to support a tablet therein on a flat surface.
Figure 2:
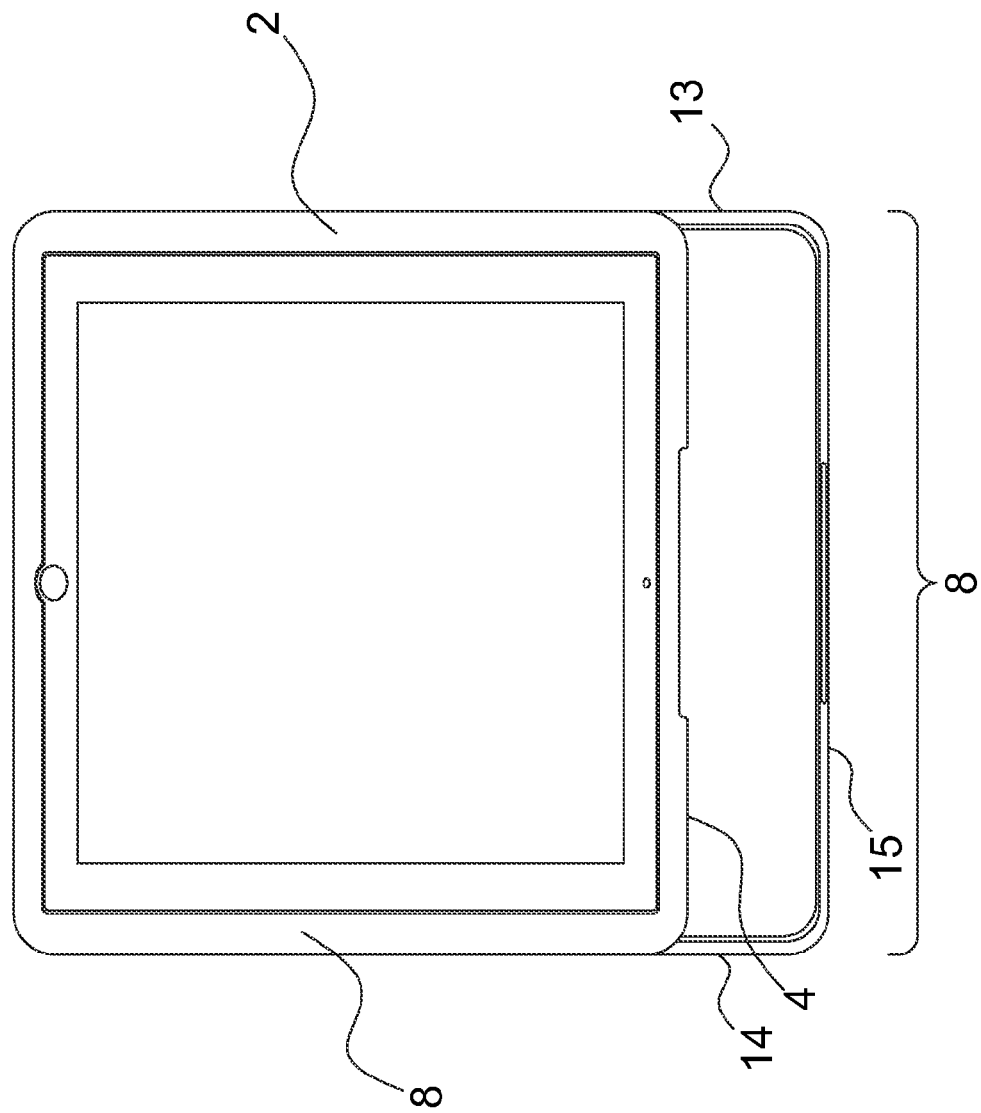
FIG. 2 is a front view of the device of FIG. 1 which can also performs hanging function to support the tablet therein over any suitable object.
Figure 3:
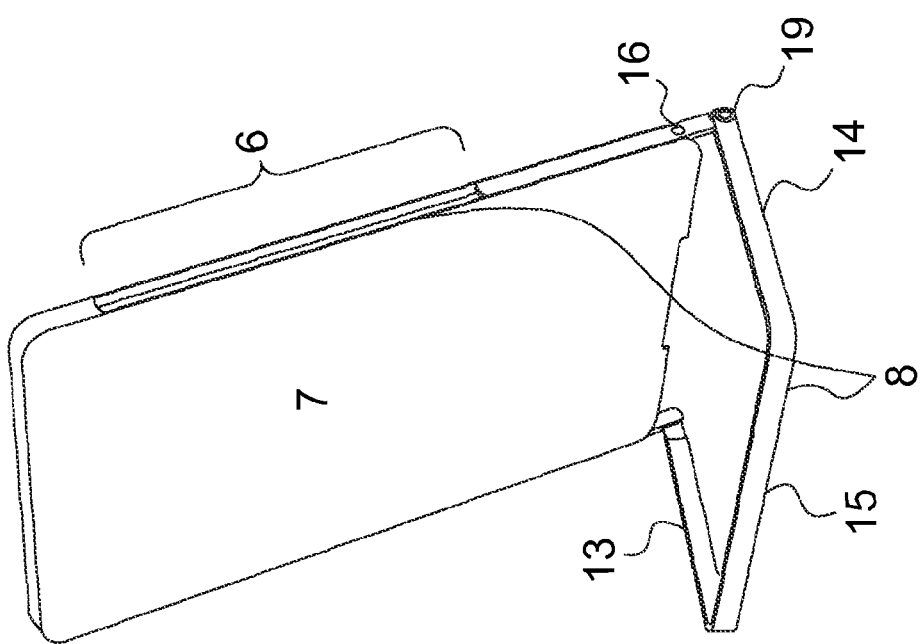
FIG. 3 is a perspective back view of the device of FIG. 1 standing on a flat surface.
Figure 4:
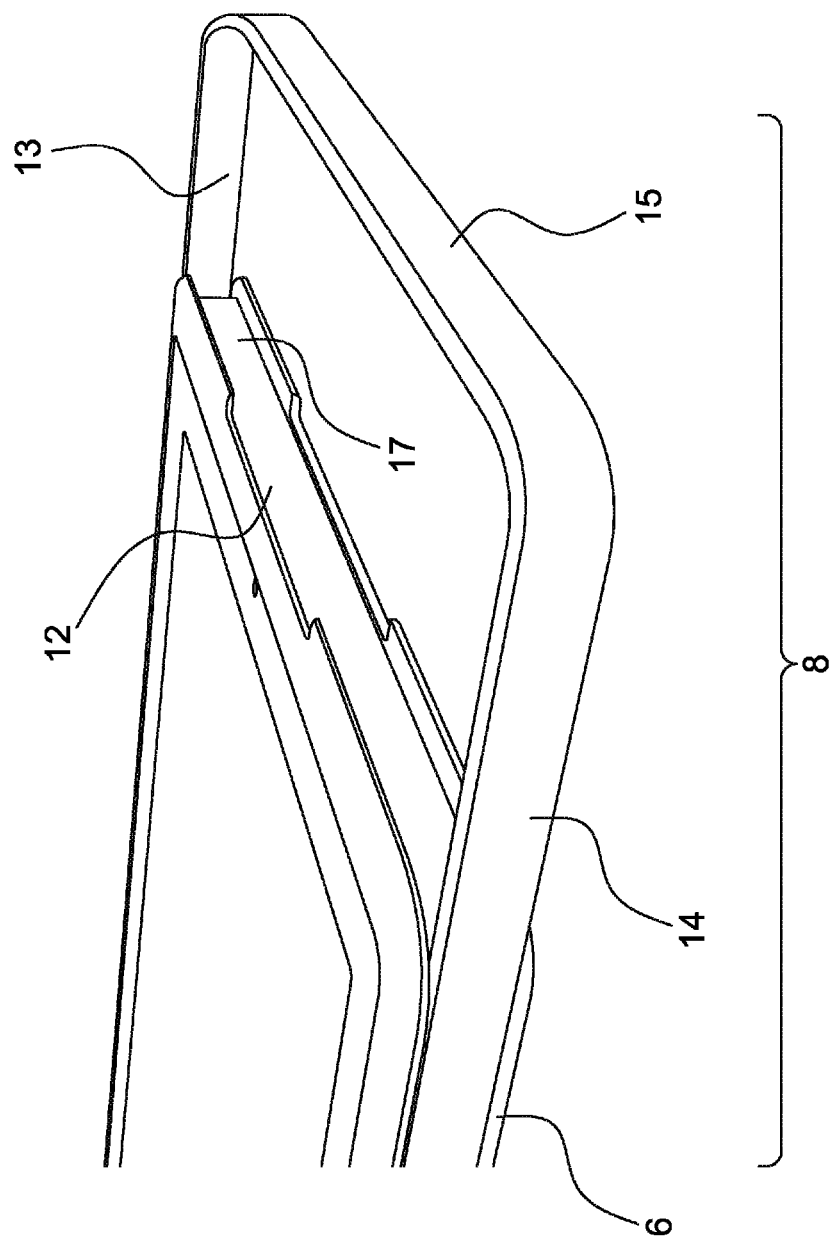
FIG. 4 is a perspective close-up view of the bottom of the device of FIG. 1 with the tablet therein according to the present invention.
Figure 5:
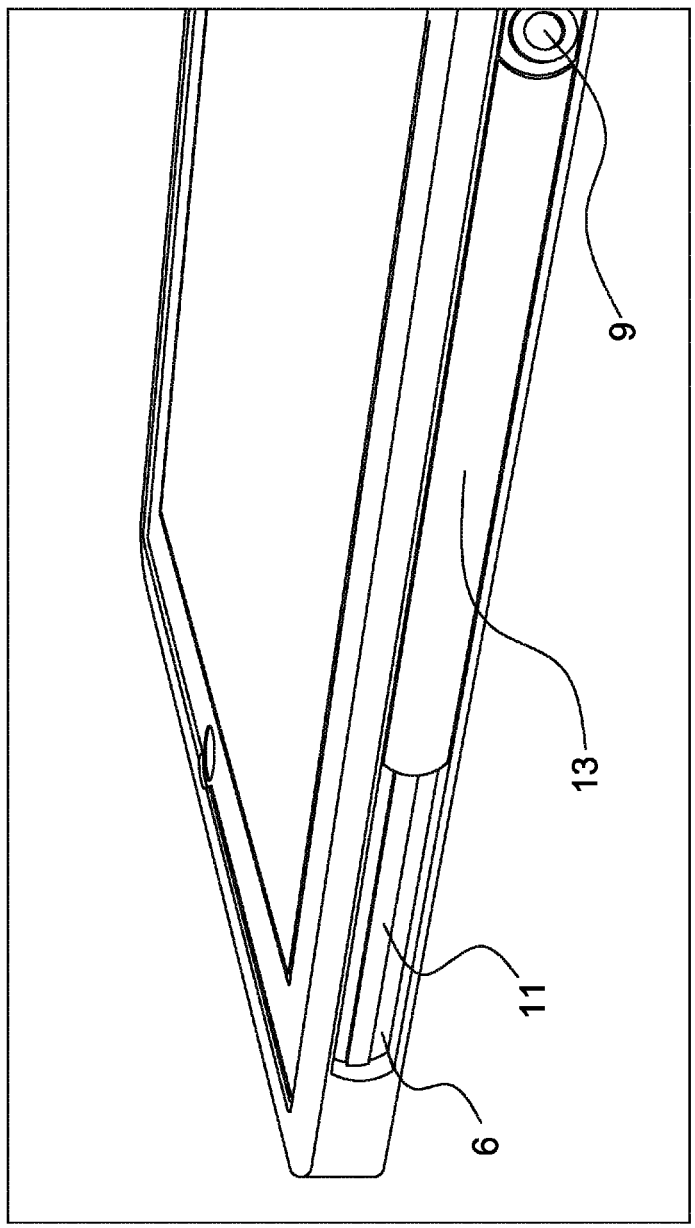
FIG. 5 is a perspective close up view of the lateral side of the device of FIG. 1 with the tablet therein.
Figure 6:
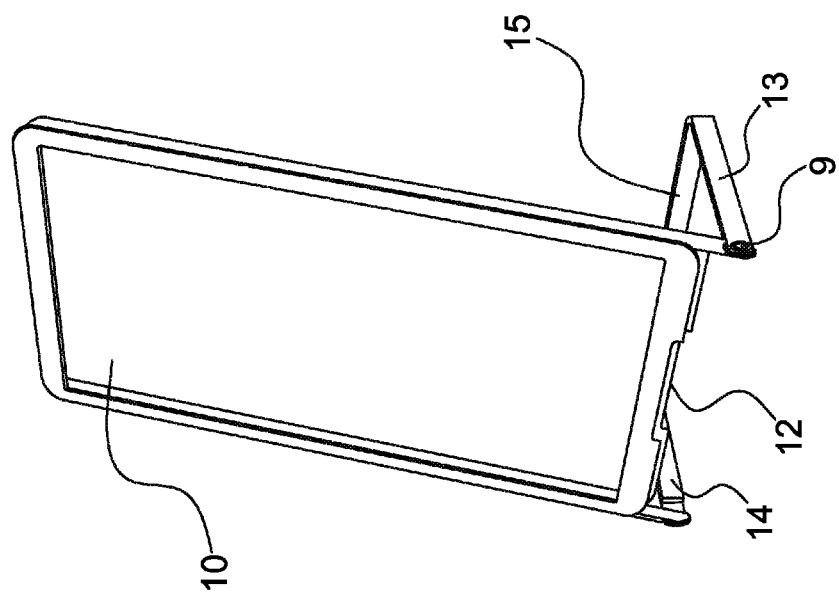
FIG. 6 is a perspective front view of the device of FIG. 1 without the tablet inserted according to the present invention on a flat surface.

Referring to FIGS. 1-6 the first embodiment is shown, the device 100 comprises a case which is substantially rectangular in shape 50 that includes a recess area 10 (shown on FIG. 6) on the front side 1 for receiving a mobile electronic device/tablet 200. The case 50 comprises a groove 6 on each of the lateral sides 2, 3 of the case 50 and a track 11 in the middle of each groove 6.

The device 100 further comprises an attachment member 8 which has a U-shape body that has a horizontal bar 15, and two vertical bars 13, 14 integrally connected to the two ends of the horizontal bar. Each of the vertical bars has two sections connected by a hinge 9 such that the vertical bars can either stay straight or bend.

The vertical bars of the attachment member 8 can move on top of the track 11 until they reach the stoppers 16 (shown on FIG. 3) near the bottom of the grooves 6 or the bottom of the groove 6 edge.

In the closed position the horizontal and vertical bars 15, 13, 14 of the attachment member 8 lie flush inside the groove 17 on the bottom side 4 (shown on FIG. 4) and grooves 6 on the lateral sides 3, 2 of the case 50. The front side 1 near the bottom side 4 of the case has a cut out 12 to allow the user to use their fingers to pry the attachment member 8 out of the groove 17.

The vertical bars 13, 14 of the attachment member 8 are pulled all the way down until it is at the bottom end of the grooves 6 and stopped by the stopper 16 to use the attachment member 8 protruding out as a handle or a hanger. In this position, the vertical bars stay straight around the hinge 9. Alternatively, the vertical bars 13, 14 of the attachment member 8 can be bent around the hinge 9 to bring the device 100 into the standing position on a flat surface.

Referring to FIGS. 7 to 13, there is disclosed a second embodiment 300 of the device according to the principle of the present invention. The device comprises an attachment member 310.

Figure 7:
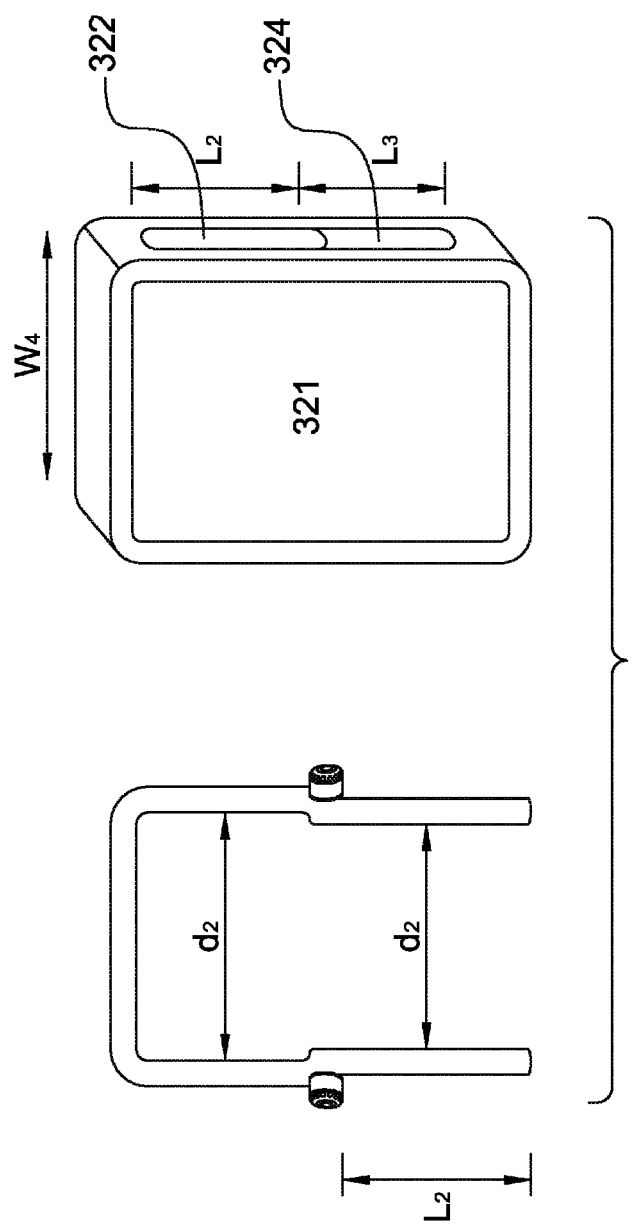
FIG. 7 is an exploded view of a second embodiment of the device according to the present invention.

As shown in FIG. 7, the attachment member 310 has a U-shaped body 311 including a horizontal bar 312 and two vertical bars 313 which are integrally connected to the two ends of the horizontal bar, two hinge joints 314 each of which connected to the bottom of each of the two vertical bars, and two elongated legs 315, each of which has one end connected to each of the hinge joints and the other end free. The distance (d1) between the two legs is smaller than the distance (d2) between the two vertical bars of the U-shaped body.

As shown in FIG. 7, the device 300 further comprises a case 320 which is designed to removably hold a mobile electronic device. The case 220 includes a recess 321 at the front side for removably receiving the mobile electronic device, two long openings 322 along the two lateral sides of the case, and two internal channels 324 beneath and open to the two long openings, along the two lateral sides for receiving the attachment member and allowing the attachment member to retract up and down. Each of the openings 322 has a diameter (W1) larger than the diameter (W2) of the leg and a length (L1) shorter than the length of the leg (L2). Each of the channels has an internal same as the diameter (W1) of the opening and larger than the diameter (W2) of the elongated leg but smaller than the width of the hinge joint (W3) of the attachment member.

Figure 8:
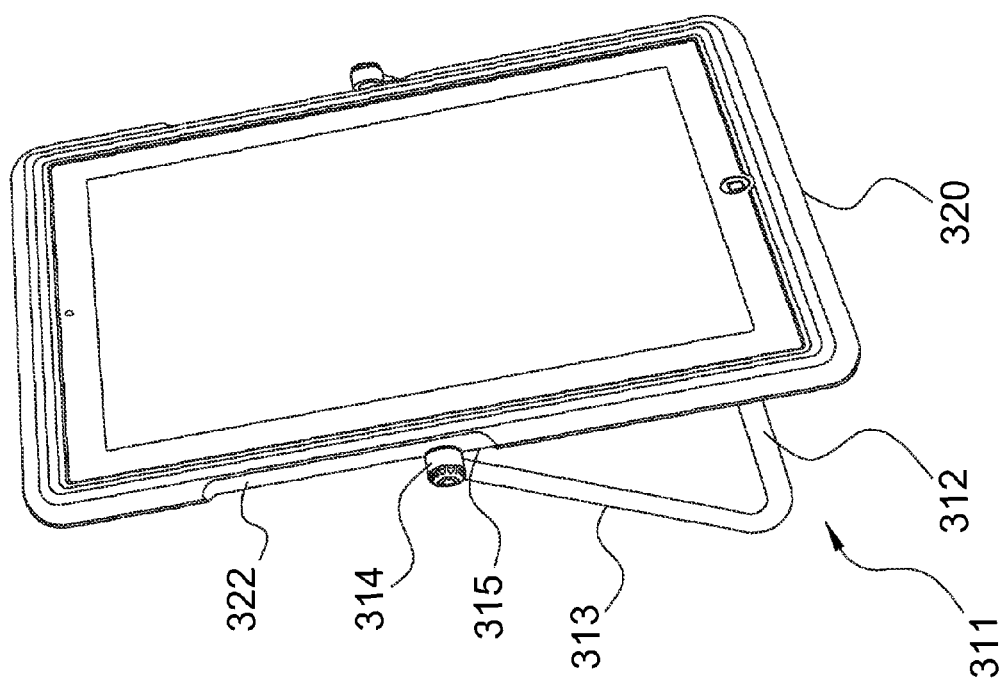
FIG. 8 is a perspective front view of a second embodiment of the device with the tablet inserted according to the present invention on a flat surface.
Figure 9:
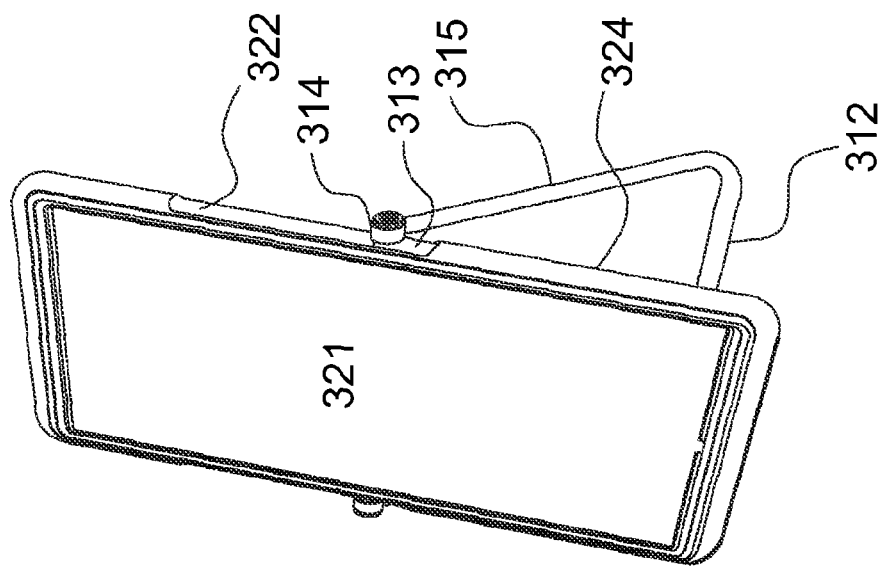
FIG. 9 is a perspective front view of a second embodiment of the device without the tablet inserted according to the present invention standing on a flat surface.

As shown in FIGS. 8 and 9, the free ends of the two elongated legs of the attachment member separately insert from the openings into the channels and stay inside the channels.

Optionally, the channels have a length (L3) shorter than the length of the leg (L2). Then, the legs can be retracted down into the channels until the two free ends reach the bottoms of the channels as shown in FIGS. 8 and 9. Optionally, if the legs are shorter than the channels the attachment can be held against the top edge of the channel using the hinge joint as a stopper.

Figure 13:
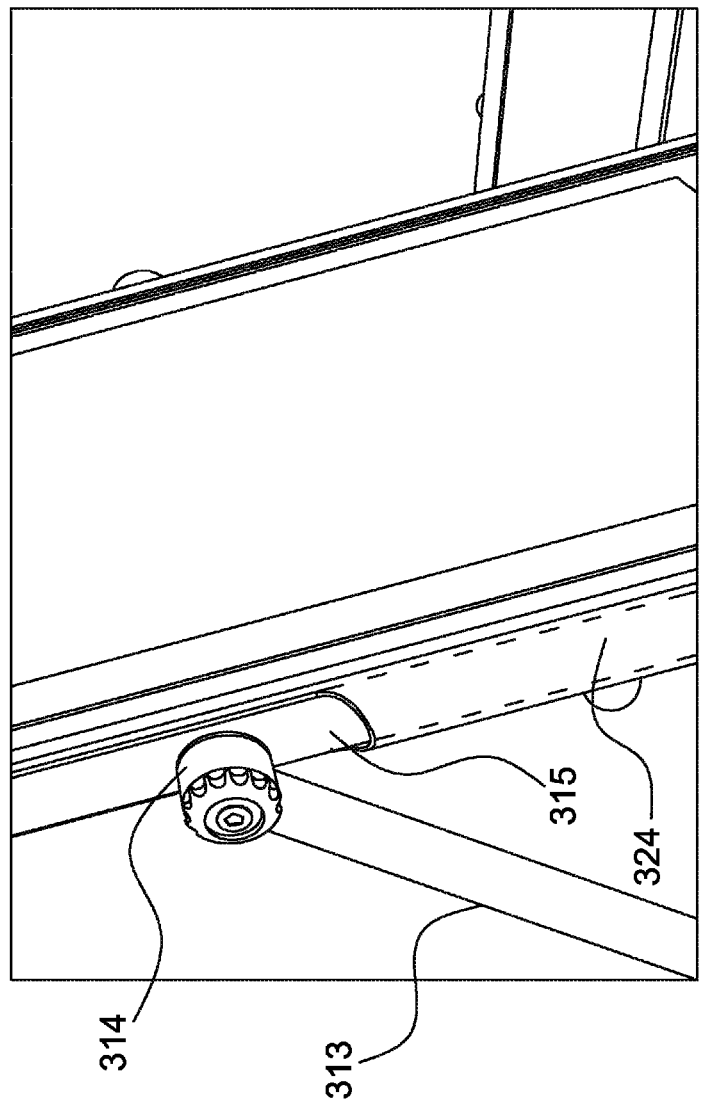
FIG. 13 is a perspective close up view of the second embodiment of the device with the tablet inserted according to the present invention standing on a flat surface.

Then, the attachment member 310 can bend at the hinge joints 314 so that the attachment can performs as a stand with the horizontal bar 312 touching a flat surface to support the mobile device on the flat surface as shown in FIGS. 8, 9 and 13). The dashed line shown in FIG. 13 indicates the internal channel 324 in a transparent view.

Figure 10:
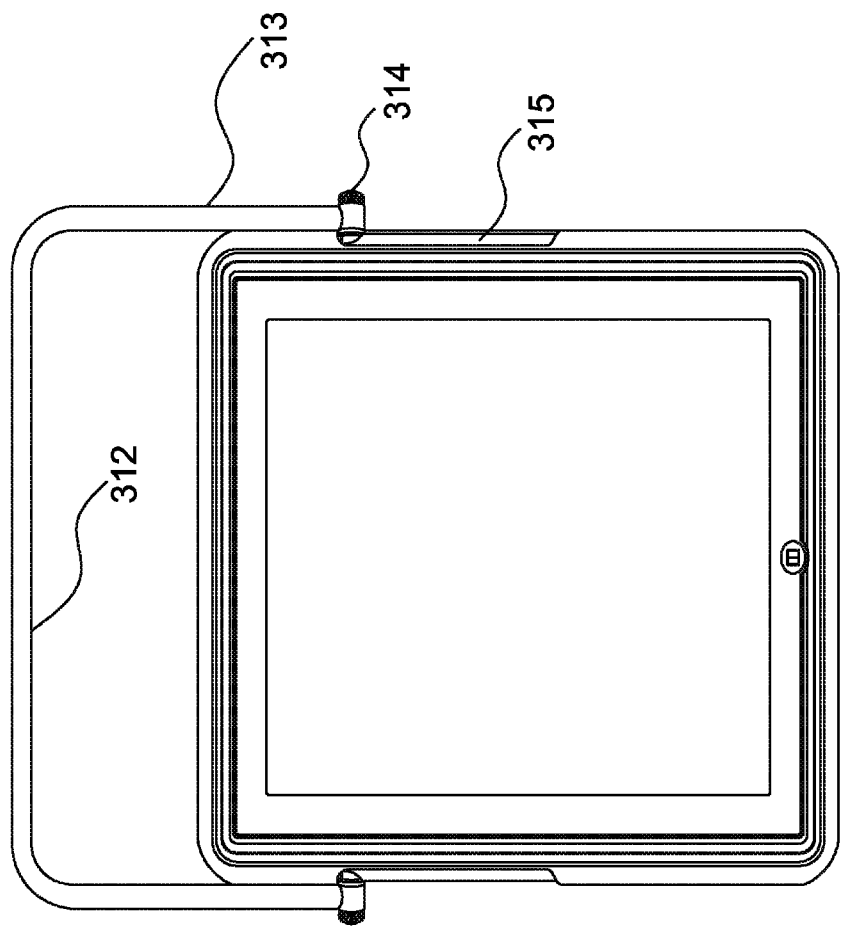
FIG. 10 is a front view of a second embodiment of the device with the tablet inserted according to the present invention.
Figure 11:
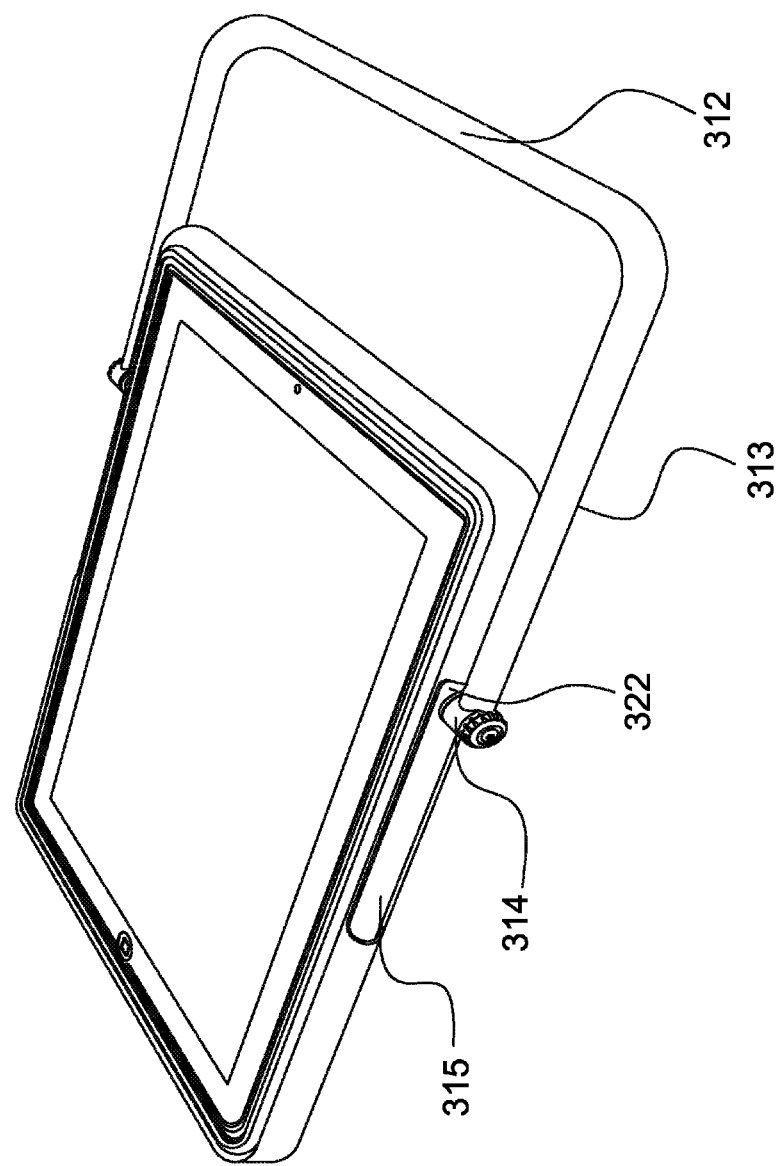
FIG. 11 is a close up view of the U-shaped body of the second embodiment of the device performing as a hanger or carry hand of the tablet therein according to the present invention.
Figure 12:
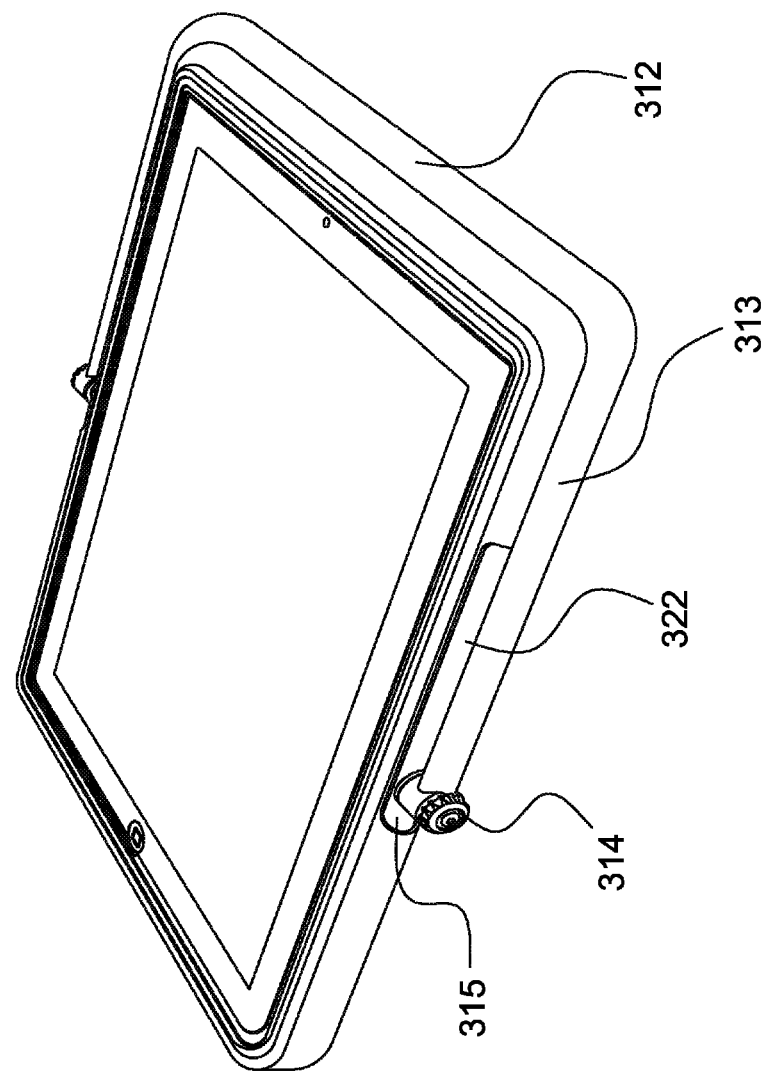
FIG. 12 is a close up view of the U-shaped body of the second embodiment of the device in a stowed position with the tablet therein according to the present invention.

Alternatively, the attachment member can perform as a loop to hang over any object for supporting a mobile device over an object including furniture such as a cabinet handle or a chair. In this position, the attachment member 310 is not bent at the hinge joints. The legs 315 and vertical bars 313 are aligned at hinge joints 314 and the legs 315 are retracted up (or pulled up) until the hinge joints 314 are stuck against the top edges of the openings 322 of the case to work as a stopper to prevent the attachment from pulling up all the way out of the case 320. The U-shaped body 311 can then perform hanging function to hang over any object to support the mobile device (as shown in FIGS. 10 and 11).

When the attachment member 310 does not function as a stand or hanger, the attachment member is not bent; the legs 315 and vertical bars 313 are aligned at hinge joints 314. Because the distance (d2) between the two vertical bars is about equivalent to or slightly larger than the width (W4) of the case so that the U-shaped body 311 can snugly enclose the top side and upper portions of the case while the legs staying inside the channels in a stowed position as illustrated in FIG. 11.

Optionally, the case 320 is further structured to have a groove or curved surface on the top side which is designed for the horizontal bar to fit in and flush with the top side of the case.

The attachment 310 may be composed of plastic, metal, or any other material. If a metal wire is used a soft rubber-like material or foam is used to encase the metal wire for protecting the surface it stands on from scratching.

The case 320 can be made in one of a variety of sizes to adapt to one of a variety of mobile devices. In general, the case has round corner design integrating the aesthetic and functional purposes.

Figure 14:
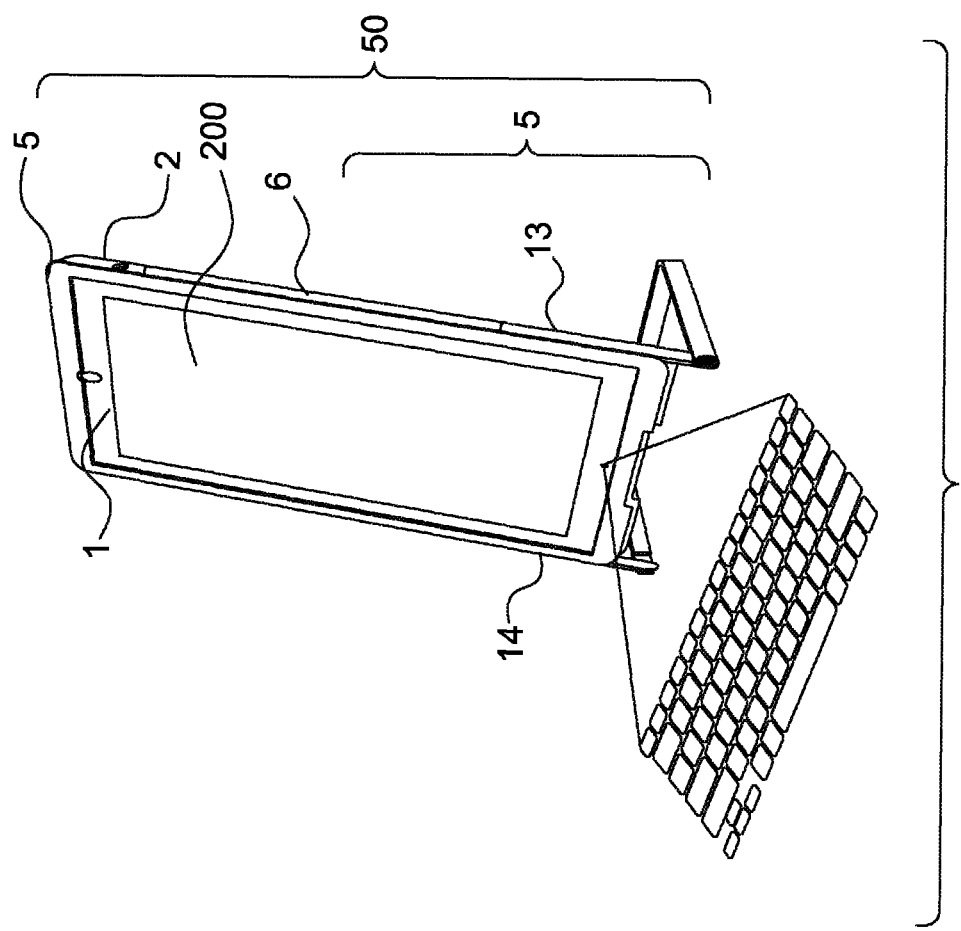
FIG. 14 is a perspective front view of a first embodiment of a device according to the present invention which can function as a mounting stand to support a tablet therein on a flat surface in an elevated position for better communication with other devices as well as for projection of a virtual keyboard.

Referring to FIG. 14 the first embodiment is shown, the device 100 comprises a case which is substantially rectangular in shape 50 that includes a recess area 10 (shown on FIG. 6) on the front side 1 for receiving a mobile electronic device/tablet 200. The case 50 comprises a groove 6 on each of the lateral sides 2, 3 of the case 50 and a track 11 in the middle of each groove 6.

As shown herein, tablet 200 is elevated above the base upon which the overall invention is situated and thus a tablet with (in this figure) a virtual keyboard feature built into the device itself is able to be facilitated without being obstructed or hindered from functioning properly. As noted here, the built in virtual keyboard can be located on the bottom of the tablet and still be able to project a virtual keyboard down onto a table for use.

Figure 15:
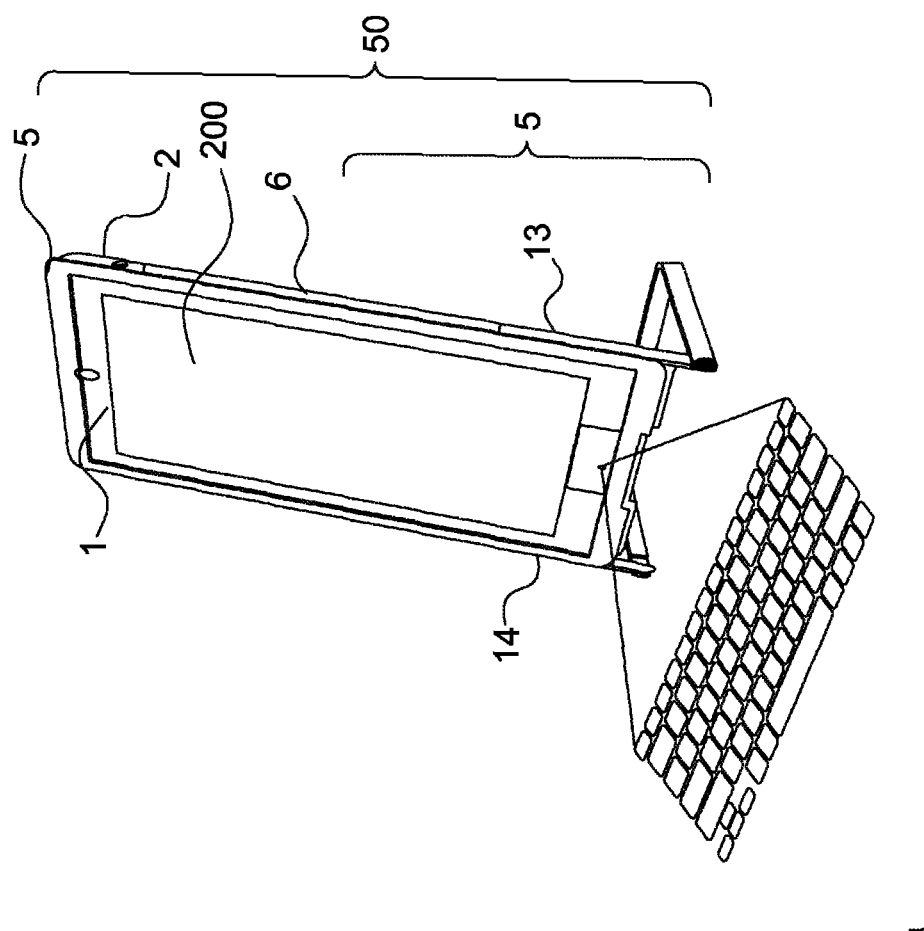
FIG. 15 is a perspective front view of a first embodiment of a device according to the present invention which shows both a stand-alone device with a virtual keyboard projection capability and an ipad electronic device both mounted within the invention device itself.

Usually, a stand-alone virtual keyboard device which looks like a small box and communicated with an ipad with bluetooth is used. Here in FIG. 15, this invention is able to support both an ipad and virtual keyboard device within the stand itself.

While there have been shown and described and pointed out the fundamental novel features of the invention as applied to the preferred embodiments, it will be understood that the foregoing is considered as illustrative only of the principles of the invention and not intended to be exhaustive or to limit the invention to the precise forms disclosed. Obvious modifications or variations are possible in light of the above teachings. The embodiments discussed were chosen and described to provide the best illustration of the principles of the invention and its practical application to enable one of ordinary skill in the art to utilize the invention in various embodiments and with various modifications as are suited to the particular use contemplated All such modifications and variations are within the scope of the invention as determined by the appended claims when interpreted in accordance with the breadth to which they are entitled.

What is claimed is:

1. A device for supporting a mobile device comprising:
an attachment member comprising:
a U-shaped body including a horizontal bar and two vertical bars integrally connected to the horizontal bar;
two hinge joints each of which connected to the bottom of each of the two vertical bars, the hinge joints enabling the attachment to stay straight or bent; and
two elongated legs each of which having one end connected to each of the hinge joints and the other end free;
a distance between the two legs being smaller than a distance between the two vertical bars of the U-shaped body; and
a case for removablly receiving one or more mobile electronic devices including:
a recessed area at the front side for removably receiving one or more mobile electronic devices;
two long openings along two lateral sides of the case, each of the openings having a diameter larger than a diameter of the leg and a length shorter than a length of the leg; and
two internal channels beneath and open to the two long openings, along two lateral sides for receiving the attachment member and allowing the attachment member to retract up and down, each of the channels having an internal diameter similar to the diameter of the opening and larger than the diameter of the elongated leg but smaller than the width of the hinge joint of the attachment member;
wherein the free ends of the two elongated legs of the attachment member separately insert from the openings into the channels and stay inside the channels.

2. The device for supporting one or more mobile devices of claim 1, wherein the attachment is composed of plastic, metal, or any other material.

3. The device for supporting one or more mobile devices of claim 2, further comprising a soft rubber-like resilient material or foam to encase the metal wire if used for aesthetic purpose or for protecting the surface it stands on from scratching.

4. The device for supporting one or more mobile devices of claim 1, wherein the case is made in one of a variety of sizes to adapt to one of a variety of mobile devices.

5. The device for supporting one or more mobile devices of claim 4, wherein the legs are retracted down in the channels until the two free ends reach bottoms of the channels or the hinge joints are stuck against top edges of the channels to work as stoppers.

6. The device for supporting one or more mobile devices of claim 5, wherein the attachment member bends at the hinge joints such that the attachment performs as a stand with the horizontal bar touching a flat surface to support the mobile device on the flat surface.

7. The device for supporting one or more mobile devices of claim 5, wherein the attachment member is not bent, the legs and vertical bars are aligned at hinge joints such that the horizontal bar snugly surrounding a bottom side of the case and the two vertical bars snugly surrounding lower portions of the two lateral sides including the openings.

8. The device for supporting one or more mobile devices of claim 7, wherein the distance (d2) between the two vertical bars is about equivalent to a width of the case and a length of the attachment is shorter than a length of the case such that the horizontal bar and vertical bars can snugly enclosing the top side and upper portions of the vertical bars of the case in a stowed position.

9. The device for supporting one or more mobile devices of claim 4, wherein the attachment member is not bent, the legs and vertical bars are aligned at hinge joints and the legs are retracted up until the hinge joints are stuck against the top edges of the openings of the case to work as a stopper to prevent the attachment from pulling up all the way out of the case, whereby the U-shaped body can perform hanging function to hang over any object to support the mobile device.

10. A device for supporting one or more mobile devices comprising:
an attachment member comprising:
a U-shaped body including a horizontal bar and two vertical bars integrally connected to the horizontal bar, each of the vertical bars having two sections connected by a hinge such that the vertical bars can stay straight or bend; and
a case for removablly receiving one or more mobile electronic devices including:
a recessed area at front side for removably receiving the mobile electronic device;
two long grooves on and along a longitudinal axis of two lateral sides of the case, each of the grooves having a track in the middle along a longitudinal axis of the groove; and
a groove on a bottom side of the case;
wherein the two vertical bars of the attachment member separately sitting on top of the track and can slide up and down on the track within the groove of the case.

11. The device for supporting one or more mobile devices of claim 10 wherein the horizontal bar of the attachment member lies inside the groove of the bottom side and flushes with the bottom side of the case and the vertical bars lie inside the grooves on the lateral sides of the case in the closed position.

12. The device for supporting one or more mobile devices of claim 10 wherein the attachment can move on top of the tracks until it reaches stoppers near a bottom of the groove on the lateral sides.

13. The device for supporting one or more mobile devices of claim 10, wherein the case further comprises a cut out at a bottom of the front side to allow a user to use their fingers to pry the attachment member out of the groove on the bottom side.

14. The device for supporting one or more mobile devices of claim 10, wherein the vertical bars of the attachment member are pulled all the way down until it reaches the bottom of the groove and stopped by the stopper to use the attachment member protruding out as a handle or a hanger.

15. The device for supporting one or more mobile devices of claim 14, wherein the vertical bars are bent around the hinge to bring the device into the standing position on a flat surface.

* * * * *